(12) United States Patent
Lu et al.

(10) Patent No.: US 9,159,564 B2
(45) Date of Patent: Oct. 13, 2015

(54) METHOD OF SHIELDING THROUGH SILICON VIAS IN A PASSIVE INTERPOSER

(71) Applicant: TAIWAN SEMICONDUCTOR MANUFACTURING COMPANY, LTD., Hsinchu (TW)

(72) Inventors: Hsiang-Tai Lu, Zhubei (TW); Chih-Hsien Lin, Tai-Chung (TW); Meng-Lin Chung, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/094,847

(22) Filed: Dec. 3, 2013

(65) Prior Publication Data

US 2014/0087548 A1    Mar. 27, 2014

Related U.S. Application Data

(62) Division of application No. 13/194,033, filed on Jul. 29, 2011, now Pat. No. 8,618,640.

(51) Int. Cl.

| | | |
|---|---|---|
| *H01L 21/265* | (2006.01) | |
| *H01L 23/552* | (2006.01) | |
| *H01L 23/14* | (2006.01) | |
| *H01L 23/498* | (2006.01) | |
| *H01L 21/768* | (2006.01) | |
| *H01L 23/522* | (2006.01) | |

(52) U.S. Cl.
CPC ............ *H01L 21/265* (2013.01); *H01L 23/147* (2013.01); *H01L 23/49827* (2013.01); *H01L 23/552* (2013.01); *H01L 21/76802* (2013.01); *H01L 23/5225* (2013.01); *H01L 2224/16* (2013.01)

(58) Field of Classification Search
USPC .......................................................... 438/637
IPC .................................................. H01L 21/76802
See application file for complete search history.

(56) References Cited

U.S. PATENT DOCUMENTS

| | | | |
|---|---|---|---|
| 4,794,432 A | 12/1988 | Hodgins et al. | |
| 6,153,451 A | 11/2000 | Erdeljac et al. | |
| 6,472,723 B1 | 10/2002 | Jarstad et al. | |
| 6,864,533 B2 | 3/2005 | Yasuhara et al. | |
| 7,030,481 B2 * | 4/2006 | Chudzik et al. | 257/700 |
| 7,560,782 B2 | 7/2009 | Pellizzer et al. | |
| 7,563,714 B2 * | 7/2009 | Erturk et al. | 438/675 |
| 7,799,678 B2 | 9/2010 | Kropewnicki et al. | |
| 7,851,393 B2 | 12/2010 | Sohn et al. | |

(Continued)

*Primary Examiner* — Eugene Lee
(74) *Attorney, Agent, or Firm* — Hauptman Ham, LLP

(57) ABSTRACT

A method of shielding through silicon vias (TSVs) in a passive interposer includes doping a substrate with positive ions, and implanting positive ions in an upper portion of the substrate, such that the substrate has at least a p-doped portion and a heavily p-doped upper portion. The method further includes forming an interlayer dielectric (ILD) above the heavily p-doped upper portion. The method further includes forming a plurality of through silicon vias (TSVs) through the ILD and the substrate, such that the passive interposer is configured to electrically couple at least one structure above and below the passive interposer. The method further includes forming, between pairs of TSVs of the plurality of TSVs, a plurality of shielding lines through the interlayer dielectric, the shielding lines configured to electrically couple the heavily p-doped upper portion of the substrate and at least one interconnect structure above the ILD.

20 Claims, 7 Drawing Sheets

(56) References Cited

U.S. PATENT DOCUMENTS

| | | |
|---|---|---|
| 7,964,972 B2 * | 6/2011 | Matsui .................... 257/774 |
| 8,053,902 B2 | 11/2011 | Chen et al. |
| 8,253,234 B2 | 8/2012 | Barowski et al. |
| 8,344,512 B2 | 1/2013 | Knickerbocker |
| 8,519,515 B2 * | 8/2013 | Kuo et al. .................... 257/621 |
| 8,618,640 B2 * | 12/2013 | Lu et al. .................... 257/659 |
| 2009/0134500 A1 | 5/2009 | Kuo |
| 2010/0032843 A1 * | 2/2010 | Chen et al. .................... 257/773 |
| 2010/0291730 A1 * | 11/2010 | Uya et al. .................... 438/73 |
| 2012/0161286 A1 | 6/2012 | Bhalla |
| 2013/0015502 A1 | 1/2013 | Fox et al. |

* cited by examiner

METHOD OF SHIELDING THROUGH SILICON VIAS IN A PASSIVE INTERPOSER

PRIORITY CLAIM

The present application is a divisional of U.S. application Ser. No. 13/194,033, filed Jul. 29, 2011, which is incorporated herein by reference in its entirety.

BACKGROUND

Recent developments in integrated circuit (IC) design have led to the use of through silicon vias (TSVs) and other structures to form three-dimensional (3D) ICs. While this area of design has increased the density of active circuits, 3D ICs also present challenges that are not encountered, or are less problematic than, in other circuit designs. One challenge is the issue of signal coupling, or interference, between TSVs as they are placed closer and closer together. Not only is the placement of the TSV a factor, but so are the higher and higher frequencies that are being used in circuits.

One previous approach known to the inventors to prevent this interference is the use of guard rings, which results in good shielding across all frequencies. However, not all TSVs can be shielded using this approach, and thus signal integrity and performance issues can remain. The guard ring approach also requires an extra shielding layer for the connection and a relatively large routing area, which adds cost and limits the shielding path (and thus, efficiency).

DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1:
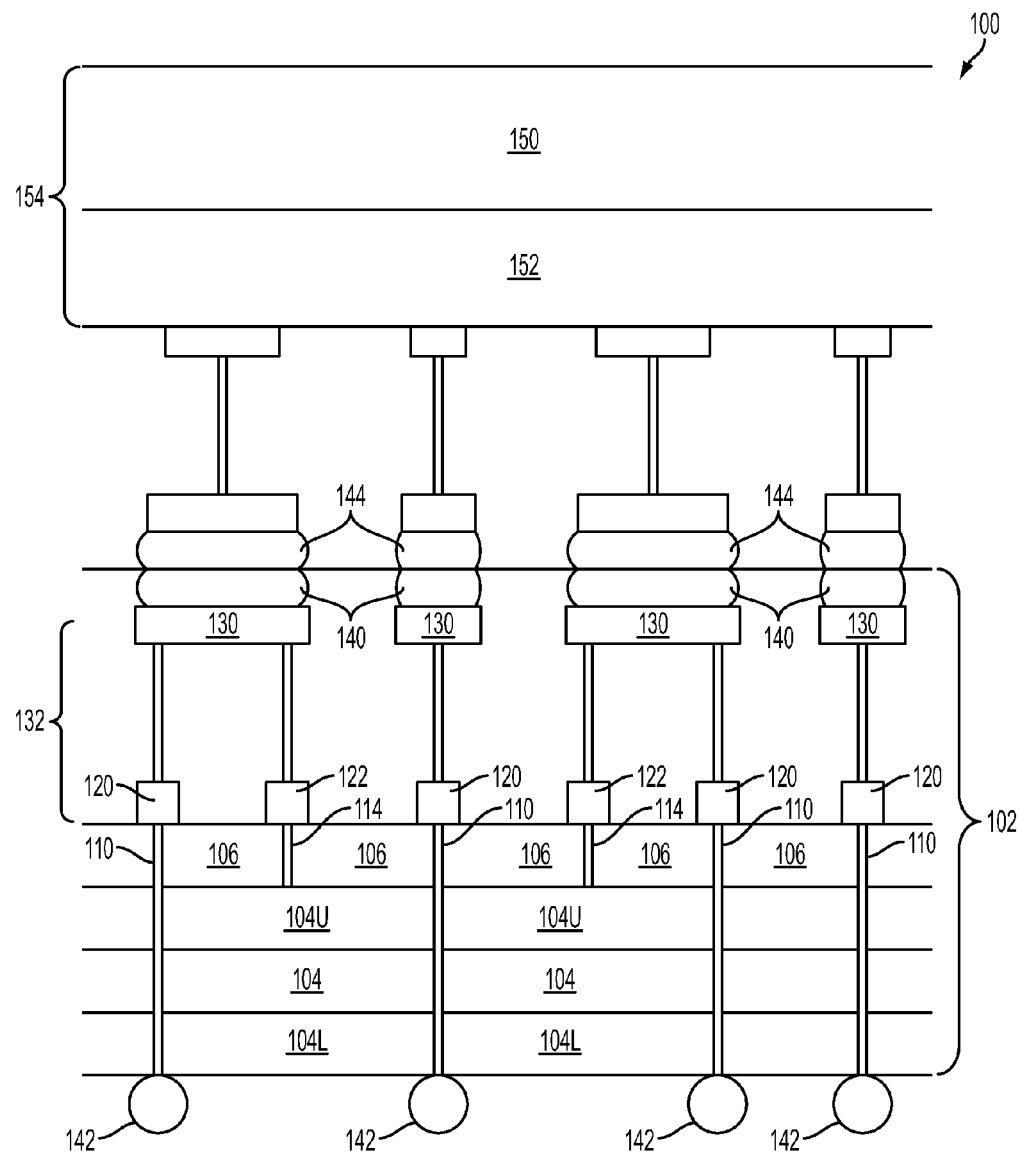
FIG. 1 is a diagram of bonded circuitry utilizing an interposer apparatus with a shielded through silicon via (TSV) configuration according to one or more embodiments.

The following disclosure provides many different embodiments, or examples, for implementing different features described below. Specific examples of components and arrangements are described below to simplify the present disclosure. These are, of course, merely examples and are not intended to be limiting. For example, various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Past methods known to the inventors for shielding through silicon vias (TSVs) utilize guard rings. In contrast with prior approaches, a solution according to one or more embodiments of the present disclosure allows for shielding of more TSVs, and thus improves performance. Likewise, the interposer of the present disclosure also reduces the routing area needed and reduces the need for extra shielding layers, thereby reducing costs.

FIG. 1 is a diagram of bonded circuitry 100 utilizing an interposer apparatus 102 with a shielded through silicon via (TSV) configuration according to one or more embodiments. Throughout the remainder of the description, the interposer will also be referred to as a passive interposer, which is used to convey a lack of active circuits included therein. The interposer apparatus 102 has a substrate 104, which is a p-doped semiconductor substrate. In some embodiments, substrate 104 (or interposer substrate 104) is a silicon wafer doped with boron. Alternatively, substrate 104 is a semiconductor wafer comprised of germanium, strained or un-strained silicon-germanium, gallium arsenide, and/or other suitable semiconductor materials. Substrate 104 is doped by any suitable process, such as in-situ doping, a diffusion process, an ion implantation process, or other doping process.

The passive interposer 102 also has an upper substrate portion 104U and a lower substrate portion 104L that are heavily p-doped regions of substrate 104. In some embodiments, the heavily doped regions 104U and 104L are formed by ion implantation performed on the previously doped substrate 104. In other embodiments other suitable processes are used to further dope upper portion 104U and lower portion 104L.

Above the heavily doped portion 104U of substrate 104 is an interlayer dielectric (ILD) 106. Interlayer dielectric 106 is a layer formed to electrically isolate additional interconnect layers above the substrate 104 from the substrate. Exemplary suitable materials for ILD 106 include silicon dioxide, silicon nitride, and silicon oxynitride. Alternatively, ILD 106 is comprised of an organic or inorganic high-k material (e.g., a spin-on material). In some embodiments, the dielectric constant of ILD 106 is at least 3.9. In other embodiments, the dielectric constant of ILD 106 is greater than 3.9. ILD 106 is formed using chemical vapor deposition (CVD), low pressure chemical vapor deposition (LPCVD), metal organic chemical vapor deposition (MOCVD), spin-on processing, and/or any other suitable process.

TSVs 110 are formed through the substrate 104 and ILD 106 and are comprised of a good conductive material, such as copper. Alternatively, a different material such as tungsten, aluminum, or titanium may be used. TSVs 110 have a barrier layer and a seed layer, which are not shown or numbered, lining channels in which TSVs 110 are formed. For instance, a barrier layer is deposited by a chemical vapor deposition (CVD) process for a material such as Ti, Ta, TiN, or TaN. A copper seed layer is then deposited, before an electroplating or electro-less plating process is used to fill the channels with a copper material. In some embodiments, a chemical mechanical polish (CMP) process is performed to planarize the top surface of TSVs 110 to the same level as the top surface of ILD 106 or the bottom surface of TSVs 110 to the same level as the bottom surface of the substrate.

Shielding lines 114 are formed through ILD 106 and are likewise comprised of a good conductive material, such as copper. Rather than forming a channel through the entirety of interposer 102, however, shielding lines 114 only connect the top surface of upper substrate portion 104U to interconnect structures formed above ILD 106. In one or more embodiments, shielding lines 114 are formed by similar processes as TSVs 110, which are mentioned above and are not repeated here for brevity. As such, shielding lines 114 may have a liner or barrier layer, and a seed layer, which is neither numbered nor shown. Shielding lines 114 are disposed between TSVs so as to reduce coupling and/or interference between TSVs.

Contact pads 120 and 122 are formed above ILD 106 and are the lowest features of an interconnect structure 132 located in passive interposer 102. Pads 120 are in direct contact with TSVs 110, while pads 122 are in direct contact with shielding lines 114. Interconnect pads 130 are electrically coupled to both the contact pads 120 and 122, as well as bump structures 140. There may be an additional number of interconnect layers and structures connecting contact pads 120 and 122 with interconnect pads 130. The conductive elements of interconnect structure 132 will comprise materials such as copper, aluminum, titanium, tungsten, tantalum, platinum, erbium, palladium, silicides thereof, nitrides thereof, combinations thereof, and/or other suitable materials. Bump structures 140 electrically connect the interconnect structures of passive interposer 102 and corresponding features of an active semiconductor wafer 154 described in further detail below. Passive interposer 102 can be adjusted to exhibit a particular voltage potential, such as ground or power, from input to output.

As part of an active semiconductor wafer 154, bump structures 144 provide electrical connections for active circuitry 152 (although the particulars of the connection between the two are not shown or numbered for clarity), which is further connected to a substrate 150. Active circuitry is used to describe a group of circuits which are used to implement semiconductor devices which also require an additional power signal. Exemplary devices include transistors or active pixel image sensors. Bump structures 144 and bump structures 140 are bonded together to electrically couple interposer 102 to semiconductor wafer 154. Thus, with the TSVs 110 of interposer 102 electrically coupled to active circuitry 152, the circuits in the semiconductor wafer are bonded to additional structures or circuits below the interposer, such as another active-circuit wafer, by using bumps 142.

Figure 2A:
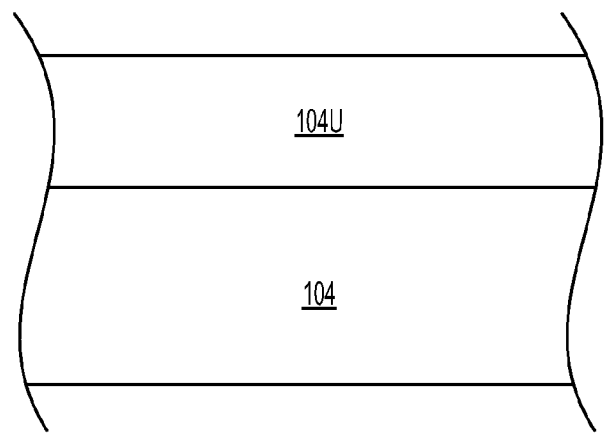
FIGS. 2A-E are partial diagrams of an interposer apparatus with a shielded TSV configuration during various stages of manufacture according to one or more embodiments.
Figure 2B:
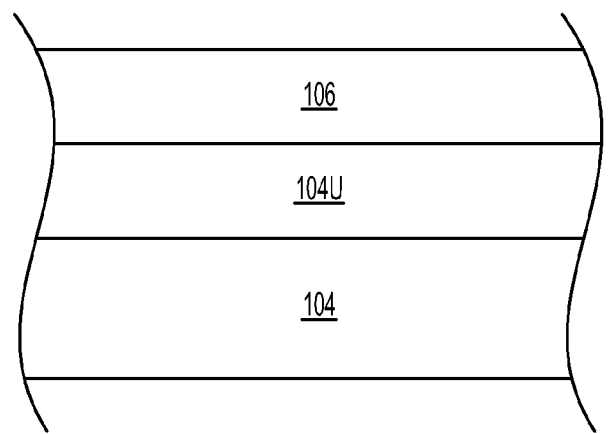

FIGS. 2A-E are partial diagrams of interposer 102 with a shielded TSV configuration during various stages of manufacture according to some one or more embodiments. In FIG. 2A, a p-doped substrate 104 is the basis for passive interposer 102. A heavily-doped upper portion 104U is formed when additional boron ions are implanted through a suitable implantation process. FIG. 2B depicts the embodiment of FIG. 2A after the formation of an interlevel dielectric 106, which is deposited above upper portion 104U. ILD 106 is deposited using a suitable deposition technique, such as CVD, PECVD, LPCVD, MOCVD, or the like.

Figure 2C:
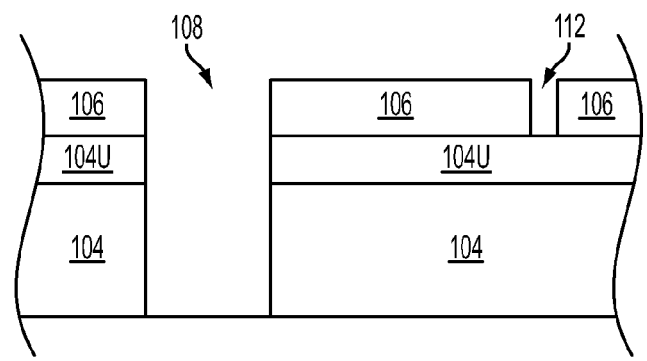

In FIG. 2C, trenches 108 and 112 (alternatively referred to as channels) are formed in or through by a suitable process in order to later be filled and used as a TSV and a shielding line, respectively. Trenches 108 and 112 may be formed through placement of one or more masks and utilization of photolithography processes. In place of or in conjunction with photolithography, wet or dry etching processes may be used.

Figure 2D:
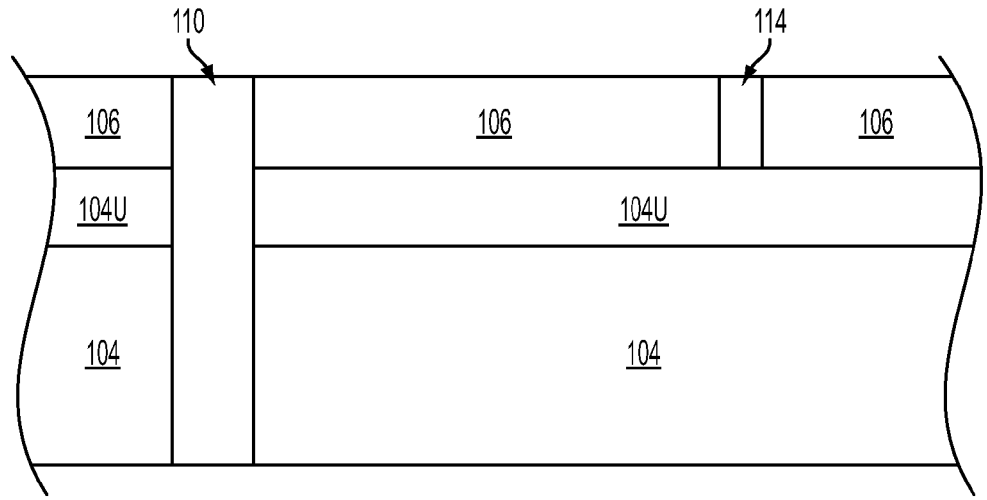
Figure 2E:
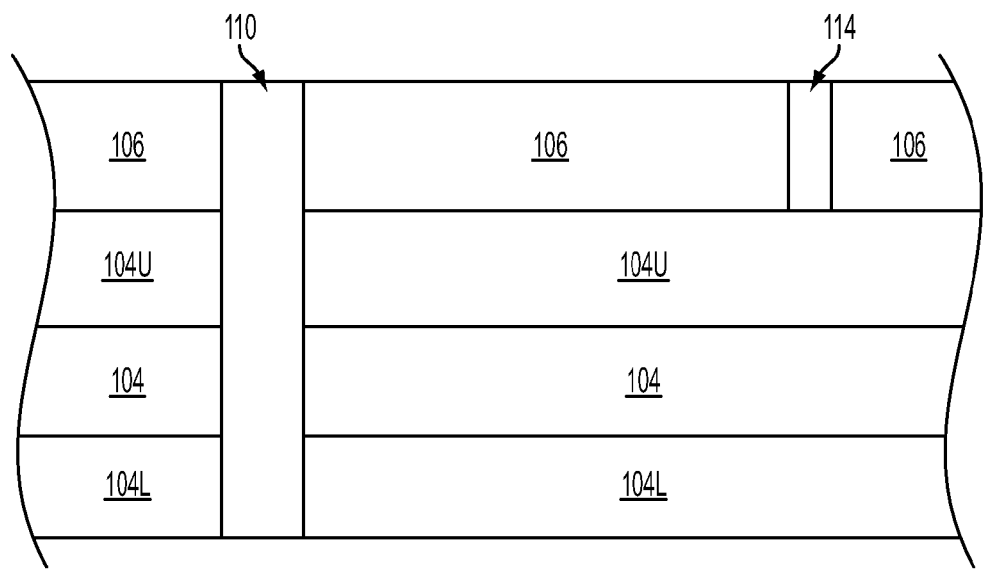

In FIG. 2D, trenches 108 and 112 are filled with a conductive material, such as copper, to form TSV 110 and shielding line 114, respectively. Not shown, but potentially part of the filling process is the deposition of a barrier layer, such as Ti, Ta, TiN, TaN, or other suitable materials by a CVD process, on the wall(s) of trenches 108 and 112. A wetting layer (i.e., seed layer) of copper may also be deposited before the TSV 110 and the shielding line 114 are filled. Then, an electroplating or electro-less plating process is used to fill trenches 108 and 112 to form TSV 110 and shielding line 114. A chemical mechanical polishing (CMP) technique may be used to planarize the structure for further processing (i.e., additional deposition forming interconnect structures and bump structures). FIG. 2E shows heavy doping of the lower portion 104L of the substrate, such as through ion implantation.

Figure 3:
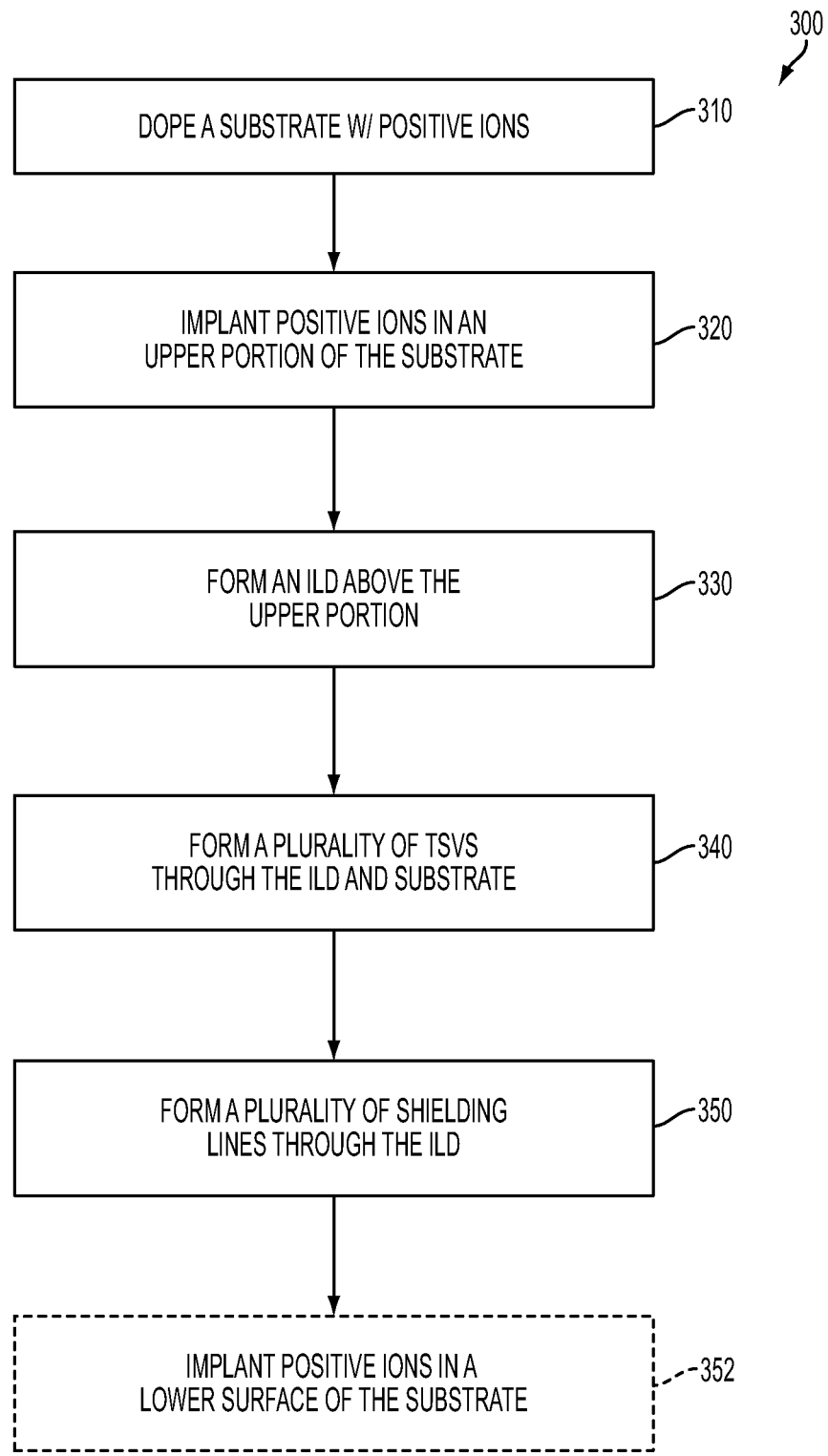
FIG. 3 is a flowchart of a method of shielding TSVs in a passive interposer according to one or more embodiments.

FIG. 3 is a flowchart of a method 300 of shielding TSVs in a passive interposer according to one or more embodiments. At a step 310, a substrate of an interposer (e.g., substrate 104) is doped with positive ions, which results in a p-doped substrate. The interposer is doped with a group V element, such as boron, through a diffusion process, in-situ doping, ion implantation, and/or another suitable process.

At a step 320, positive ions are implanted in an upper portion of the substrate, resulting in a heavily p-doped portion of the substrate, e.g., upper portion 104U. At a step 330, an interlayer dielectric, e.g., ILD 106, is formed above the upper portion of the substrate by a suitable CVD process, such as those mentioned above.

At a step 340, TSVs (e.g., TSVs 110) are formed through the ILD and the doped substrate. The TSVs that are formed are configured to electrically connect structures above and below the substrate. In some embodiments, the coupled structures are interconnect structures above and bump structures below the substrate. In other embodiments, other electrical connections between structures are made. The formation of TSVs in step 340 is accomplished by forming a trench, e.g., trench 108, through the ILD and doped substrate (by photolithography, etching, or both), depositing by CVD a barrier layer, such as TiN, and electroplating the trench with copper. Other suitable techniques for formation of the TSVs may be used.

At a step 350, shielding lines are formed through the ILD, which are configured to electrically couple the upper portion of the substrate to an interconnect structure. In some embodiments, the shielding line formation is substantially similar to step 340 with regard to the materials and techniques used. In step 350, the trench formed through the ILD 106 extends to the heavily doped upper portion of the interposer substrate and not to the remainder of substrate 102.

At an optional step 352, positive ions are implanted in a lower portion of the substrate as well. Thus, if step 352 is omitted, the interposer substrate has a p-doped portion and a heavily p-doped portion. If step 352 is performed, the interposer substrate has a center portion that is p-doped and upper and lower portions, which are heavily p-doped.

Figure 4A:
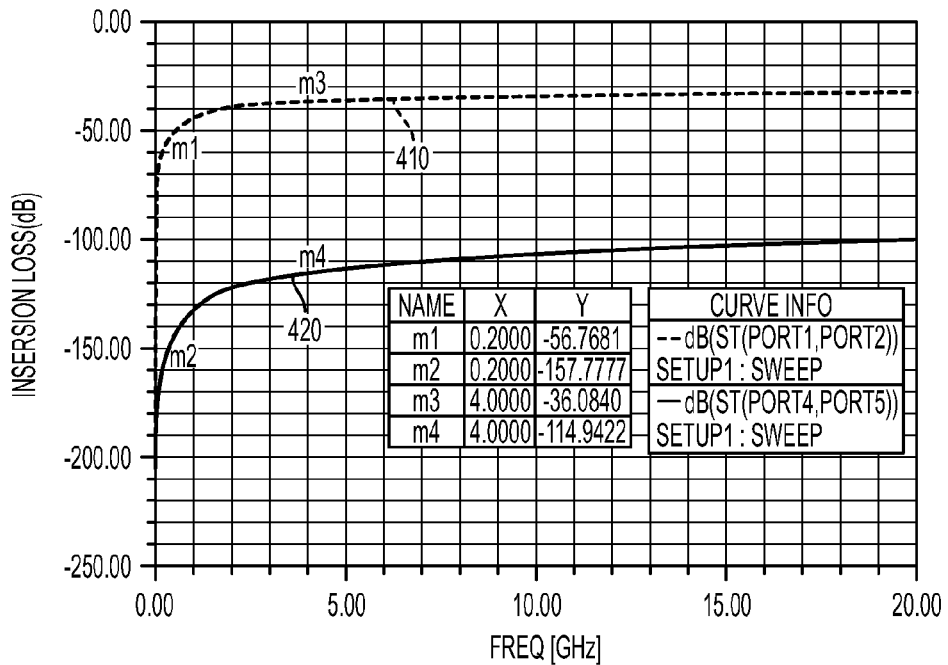
FIGS. 4A-4C are graphs of coupling characteristics of shielded and unshielded interposer substrates.
Figure 4B:
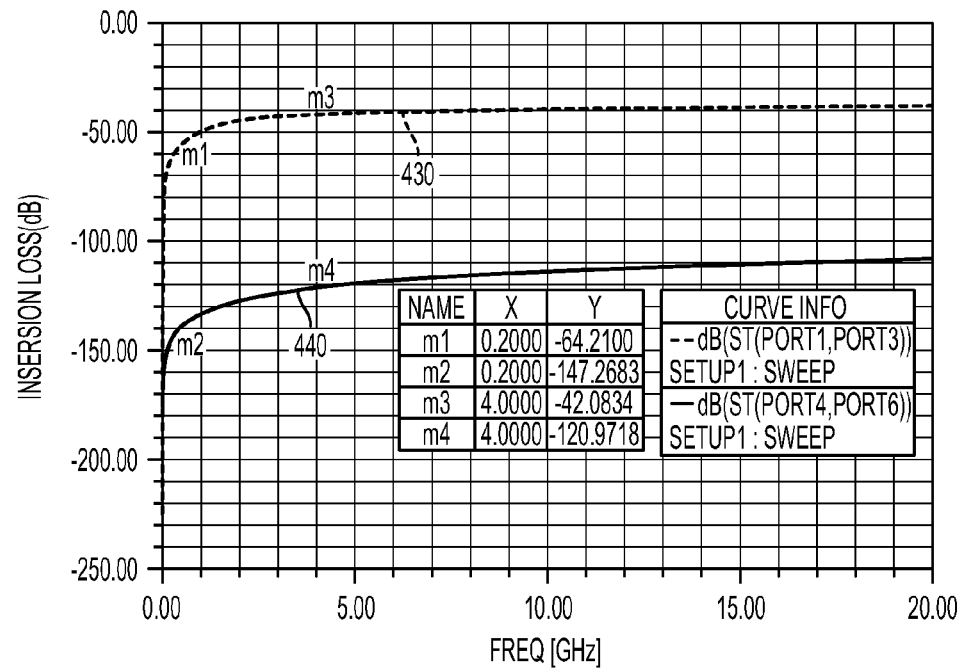
Figure 4C:
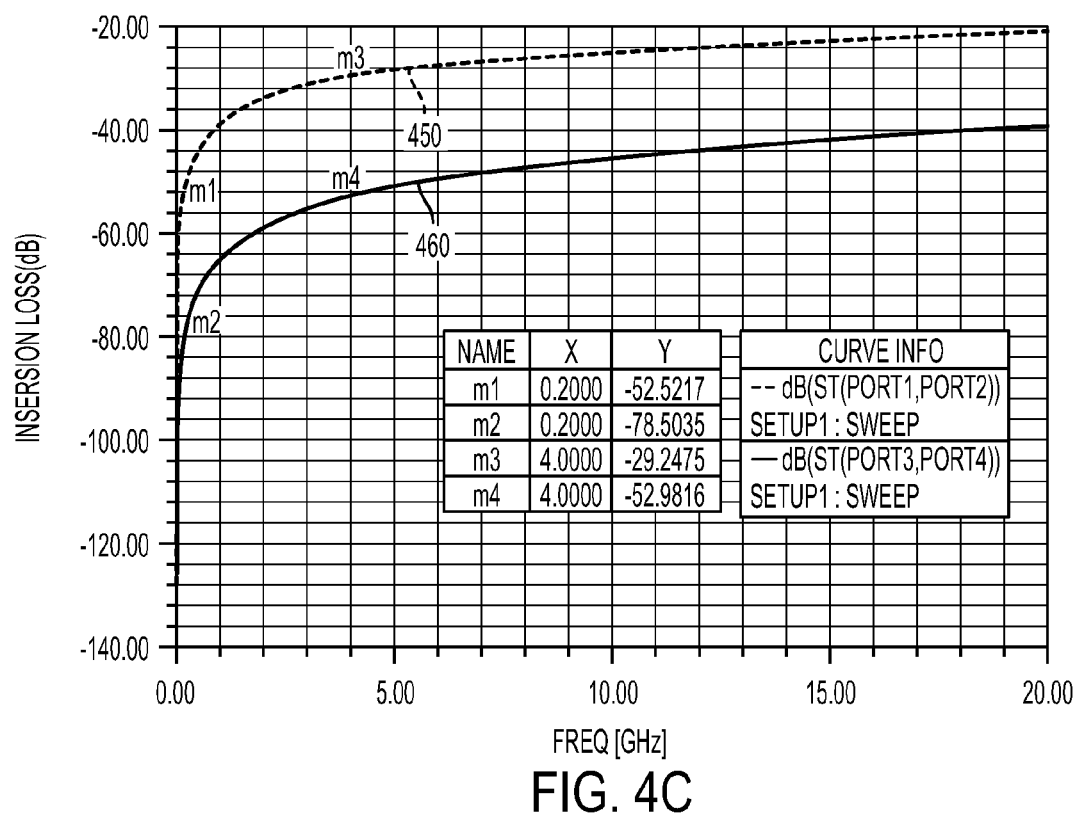

FIGS. 4A-4C are graphs of coupling characteristics of shielded and unshielded interposer substrates according to one or more embodiments. Each of the three graphs has an x-axis representing the frequency of the signal present in the interposer and has a y-axis representing the insertion loss (in decibels) of the signal. The individual graphs show the de-coupling effects of the shielded interposer with respect to three different structures in the active wafer and in the passive interposer.

In FIG. 4A, the insertion loss between a first metallization layer (M1) (i.e., first layer of a interconnect structure) and the first metallization layer in a bonded device (MB) is shown. In this graph, a curve 410 represents the unshielded substrate and a curve 420 represents the shielded substrate. The insertion loss in decibels is significantly reduced across the shown frequencies, two specific frequencies of which are marked in the graph. For example, the insertion losses at 200 megahertz (MHz) and 4 gigahertz (GHz) are approximately three times as large without shielding than with shielding. In FIG. 4B, adjacent first metallization structures (M1 and M1) are shown with an unshielded curve 430 and a shielded curve 440. The losses are reduced by a multiple of more than two times. In FIG. 4C, an unshielded curve 450 and a shielded curve 460 show a nearly 50% reduction with regard to isolating the first interconnect structure and TSVs.

Figure 5:
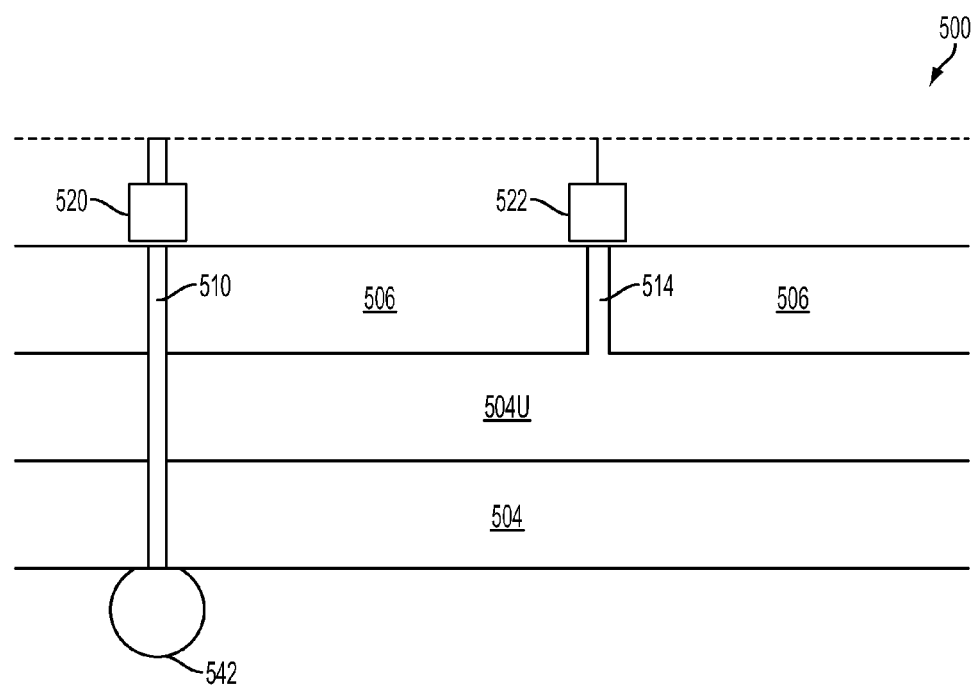
FIG. 5 is a diagram of bonded circuitry utilizing an interposer apparatus with a shielded through silicon via (TSV) configuration according to one or more other embodiments.

FIG. 5 is a simplified diagram of an interposer apparatus 502 with a shielded TSV configuration according to another embodiment. Similar to FIG. 1, an interposer substrate 504 is shown. In this embodiment, however, the interposer 502 comprises a p-doped substrate 504 and a heavily p-doped upper portion 504U and does not comprise a heavily p-doped lower portion in contrast with the FIG. 1 embodiment). A TSV 510 and a shielding line 514 are shown that are substantially similar to TSV 110 and shielding line 114 shown in FIG. 1.

An ILD 506 isolates the substrate from interconnect structures, which include contact pads 520 and 522. TSV 510 electrically couples contact pad 520 and a bump structure 542, while shielding line 514 electrically couples contact pad 522 and the upper substrate portion 504. The operation of passive interposer 502 is substantially similar to that of FIG. 1 without needing to perform the additional step of heavily doping the lower portion of the substrate (e.g., through ion implantation of additional boron atoms). Passive interposer 502 is configurable to have a particular voltage potential, such as ground or power, from input to output.

One aspect of this description relates to a method of shielding through silicon vias (TSVs) in a passive interposer. The method includes doping a substrate with positive ions, and implanting positive ions in an upper portion of the substrate, such that the substrate has at least a p-doped portion and a heavily p-doped upper portion. The method further includes forming an interlayer dielectric (ILD) above the heavily p-doped upper portion. The method further includes forming a plurality of through silicon vias (TSVs) through the ILD and the substrate, such that the passive interposer is configured to electrically couple at least one structure above and below the passive interposer. The method further includes forming, between pairs of TSVs of the plurality of TSVs, a plurality of shielding lines through the interlayer dielectric, the shielding lines configured to electrically couple the heavily p-doped upper portion of the substrate and at least one interconnect structure above the ILD.

Another aspect of this description relates to a method of forming bonded circuitry. The method includes doping an upper portion of a substrate, wherein the upper portion extends substantially across an entirety of the substrate, and forming an interlayer dielectric layer (ILD) over the upper portion of the substrate. The method further includes forming a plurality of through silicon vias (TSVs) extending through the ILD and a portion of the substrate, wherein at least one TSV of the plurality of TSVs electrically couples a respective first metal contact pad above the ILD to a first bump structure below the substrate. The method further includes forming a plurality of shielding lines electrically coupling a respective second metal contact pads to the upper portion of the substrate, wherein the shielding lines of the plurality of shielding lines are disposed between adjacent TSVs of the plurality of TSVs, and the plurality of shielding lines are formed simultaneously with the plurality of TSVs.

Still another aspect of this description relates to a method of forming bonded circuitry. The method includes doping an upper portion of a p-doped substrate to form a first heavily doped region, wherein the upper portion extends substantially across an entirety of the p-doped substrate. The method further includes forming an interlayer dielectric layer (ILD) over the upper portion of the p-doped substrate, and forming a plurality of through silicon vias (TSVs) extending through the ILD and the substrate, wherein at least one TSV of the plurality of TSVs electrically couples a respective first metal contact pad above the ILD to a first bump structure below the p-doped substrate. The method further includes forming a plurality of shielding lines electrically coupling a respective second metal contact pads to the upper portion of the substrate, wherein the shielding lines of the plurality of shielding lines are disposed between adjacent TSVs of the plurality of TSVs, and the plurality of shielding lines are formed simultaneously with the plurality of TSVs. The method further includes doping a lower portion of the p-doped substrate to form a second heavily doped region, wherein the lower portion extends substantially across an entirety of the p-doped substrate.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of shielding through silicon vias (TSVs) in a passive interposer, the method comprising:
    doping a substrate with positive ions;
    implanting positive ions in an upper portion of the substrate, such that the substrate has at least a p-doped portion and a heavily p-doped upper portion, wherein the heavily p-doped upper portion extends substantially across an entirety of the substrate;
    forming an interlayer dielectric (ILD) above the heavily p-doped upper portion;
    forming a plurality of through silicon vias (TSVs) through the ILD and the substrate, such that the passive interposer is configured to electrically couple at least one structure above and below the passive interposer; and
    forming, between pairs of TSVs of the plurality of TSVs, a plurality of shielding lines through the interlayer dielectric, the shielding lines configured to electrically couple the heavily p-doped upper portion of the substrate and at least one interconnect structure above the ILD, and the heavily p-doped upper portion separates the plurality of shielding lines from the p-doped portion of the substrate.

2. The method of claim 1, further comprising forming an output pin configured to bias the passive interposer.

3. The method of claim 1, further comprising implanting positive ions in a lower portion of the substrate, such that the substrate has at least a p-doped portion, a heavily p-doped upper portion, and a heavily p-doped lower portion.

4. The method of claim 3, further comprising forming an output pin configured to bias the passive interposer.

5. The method of claim 1, wherein implanting positive ions in the upper portion of the substrate comprises implanting boron.

6. The method of claim 1, wherein forming the ILD comprises depositing the ILD using chemical vapor deposition (CVD), low pressure CVD (LPCVD), metal organic CVD (MOCVD), or spin-on processing.

7. The method of claim 1, wherein forming the plurality of TSVs comprises forming a barrier layer between each TSV of the plurality of TSVs and the ILD.

8. The method of claim 7, wherein forming the barrier layer comprises forming the barrier layer comprising at least one of Ti, Ta, TiN, or TaN.

9. The method of claim 1, wherein forming the plurality of TSVs comprises plating copper in an opening in the ILD.

10. The method of claim 1, wherein forming the plurality of TSVs comprises planarizing a top surface of each TSV of the plurality of TSVs to be at a same level as a top surface of the ILD.

11. A method of forming bonded circuitry, the method comprising:
    doping an upper portion of a substrate, wherein the doped upper portion extends substantially across an entirety of the substrate;
    forming an interlayer dielectric layer (ILD) over the upper portion of the substrate;
    forming a plurality of through silicon vias (TSVs) extending through the ILD and a portion of the substrate, wherein at least one TSV of the plurality of TSVs electrically couples a respective first metal contact pad above the ILD to a first bump structure below the substrate; and
    forming a plurality of shielding lines electrically coupling a respective second metal contact pads to the upper portion of the substrate, wherein the shielding lines of the plurality of shielding lines are disposed between adjacent TSVs of the plurality of TSVs, and the plurality of shielding lines are formed simultaneously with the plurality of TSVs.

12. The method of claim 11, wherein forming the plurality of TSVs comprises forming a trench through the ILD and in the substrate for each TSV of the plurality of TSVs, wherein forming the trench comprises performing at least one of a photolithography process or an etching process.

13. The method of claim 12, wherein forming the plurality of TSVs further comprises:
    forming a barrier layer on sidewalls of the trench; and
    forming a conductive layer on the barrier layer.

14. The method of claim 13, wherein forming the conductive layer comprises electroplating a copper layer.

15. The method of claim 12, wherein forming the trench comprises forming the trench through the upper portion of the substrate, wherein a bottom surface of the trench is within the substrate.

16. The method of claim 11, further comprising doping a lower portion of the substrate opposite the upper portion of the substrate.

17. The method of claim 16, wherein doping the lower portion of the substrate comprises forming a first heavily doped region in the lower portion of the substrate, and doping the upper portion of the substrate comprises forming a second heavily doped region in the upper portion of the substrate.

18. The method of claim 17, wherein doping the lower portion of the substrate comprises forming a lightly doped portion in a middle of the substrate between the first heavily doped portion and the second heavily doped portion.

19. A method of forming bonded circuitry, the method comprising:
    doping an upper portion of a p-doped substrate to form a first heavily doped region, wherein the doped upper portion extends substantially across an entirety of the p-doped substrate;
    forming an interlayer dielectric layer (ILD) over the upper portion of the p-doped substrate;
    forming a plurality of through silicon vias (TSVs) extending through the ILD and the substrate, wherein at least one TSV of the plurality of TSVs electrically couples a respective first metal contact pad above the ILD to a first bump structure below the p-doped substrate;
    forming a plurality of shielding lines electrically coupling a respective second metal contact pads to the upper portion of the substrate, wherein the shielding lines of the plurality of shielding lines are disposed between adjacent TSVs of the plurality of TSVs, and the plurality of shielding lines are formed simultaneously with the plurality of TSVs; and
    doping a lower portion of the p-doped substrate to form a second heavily doped region, wherein the lower portion extends substantially across an entirety of the p-doped substrate.

20. The method of claim 19, wherein doping the upper portion of the p-doped substrate comprises defining a lightly doped region in the p-doped substrate between the first heavily doped region and the second heavily doped region.

\* \* \* \* \*